United States Patent [19]
Noro

[11] Patent Number: 5,939,931
[45] Date of Patent: Aug. 17, 1999

[54] DRIVING CIRCUIT HAVING DIFFERENTIAL AND H-BRIDGE CIRCUITS FOR LOW VOLTAGE POWER SOURCE

[75] Inventor: Masao Noro, Hamamatsu, Japan

[73] Assignee: Yamaha Corporation, Hamamatsu, Japan

[21] Appl. No.: 08/978,507

[22] Filed: Nov. 25, 1997

[30] Foreign Application Priority Data

Nov. 29, 1996 [JP] Japan ................................. 8-319720

[51] Int. Cl.$^6$ ................................................ H03K 17/56
[52] U.S. Cl. ........................ 327/424; 327/108; 327/423; 327/508; 330/146; 363/63
[58] Field of Search ................................. 327/108, 109, 327/110, 111, 423, 424, 508, 588; 363/63, 58; 330/146

[56] References Cited

U.S. PATENT DOCUMENTS

| | | | |
|---|---|---|---|
| 4,805,214 | 2/1989 | Fensch et al. .......................... | 379/399 |
| 5,631,595 | 5/1997 | Lakshmikumar ....................... | 327/362 |

*Primary Examiner*—Kenneth B. Wells
*Assistant Examiner*—Minh Nguyen

*Attorney, Agent, or Firm*—Graham & James LLP

[57] ABSTRACT

A driving circuit has first and second output terminals for connection with a load, for supplying the load with a constant voltage changing in polarity at predetermined timing, through the output terminals. A bridge circuit has first and second output nodes connected, respectively, to the first and second output terminals. A selector circuit selectively drives a plurality of current changeover switching elements of the bridge circuit. First and second differential amplifier circuits have first input terminals supplied with a predetermined reference voltage and second input terminals connected, respectively, to the first and second output nodes, and a common output terminal. A switching circuit selectively connects the first and second differential amplifier circuits to a power source in response to selective driving of the current changeover switching elements by the selector circuit. A bypass circuit is connected to the common output terminal of the first and second differential amplifier circuits to have conductivity thereof controlled by an output from the common output terminal, for bypassing part of current from the constant current source such that output voltage from the bridge circuit becomes equal to the predetermined reference voltage

5 Claims, 3 Drawing Sheets

DRIVING CIRCUIT HAVING DIFFERENTIAL AND H-BRIDGE CIRCUITS FOR LOW VOLTAGE POWER SOURCE

BACKGROUND OF THE INVENTION

1. Field of the Invention

The present invention relates to a driving circuit which is adapted for use as a driver for driving S/T points in ISDN user-network interfaces or the like, and which has two output terminals for connection with a load, for supplying the load with a constant voltage changing in polarity at predetermined timing, through the output terminals.

2. Prior Art

Conventionally, as a line driver such as an S/T point driver for use in ISDN user-network interfaces, a driving circuit as shown in FIG. 1 is known. A bridge circuit 1 is formed of four n-channel MOS transistors (hereinafter referred to as "NMOS transistors") N1–N4 and driven by a constant current source 11. The bridge circuit 1 has two bridge output nodes A and B connected, respectively, to two output terminals (line output terminals) OUT1 and OUT2 for connection with a load Z. The NMOS transistors N1–N4 are selectively turned on by outputs from a selector circuit 4 such that the transistors N1, N4 are simultaneously turned on at a certain timing, while the transistors N2, N3 are simultaneously turned on at another timing, whereby a signal voltage changing in polarity is supplied to the load Z. The constant voltage source 11 is adapted to supply current in an amount exceeding an amount required for driving the load Z.

An NMOS transistor N7 is provided as a bypass circuit 3 for bypassing an extra amount of current from the constant current source 11 in response to output voltage supplied from the output terminals OUT1, OUT2 to the load z in order to always maintain the output voltage equal to constant reference voltage VREF. A differential amplifier circuit 2 feedback-controls the conductivity of the NMOS transistor 7. The differential amplifier circuit 2 is comprised of a current mirror circuit formed by NMOS transistors N5 and N6, to serve as an active load, and a pair of p-channel MOS transistors (hereinafter referred to as "PMOS transistors") P1 and P2 for differential amplification. One of the differential amplification PMOS transistors P1, P2 has an input terminal thereof supplied with the reference voltage VREF, and the other has an input terminal thereof supplied with a higher one of two output voltages from the two output nodes A, B of the bridge circuit 1, that is to be controlled. NMOS transistors N8 and N9 are provided as transfer gates for selecting either of the output voltages from the output nodes A, B and applying the same to the differential amplifier circuit 2.

Let it now be assumed that the NMOS transistors N2, N3 of the bridge circuit 1 are turned on, while the NMOS transistors N1, N4 are turned off. In this state, the output terminal OUT2 is grounded, and an output voltage appears at the output terminal OUT1. At this time, the NMOS transistor N8 as the transfer gate is turned on so that the output voltage at the output terminal OUT1 is fed back to the differential amplifier circuit 2, whereby the NMOS transistor N7 bypasses the extra amount of current from the constant current source 11 by which the current amount from the constant current source 11 exceeds the amount required for driving the load Z until the output voltage becomes equal to the reference voltage VREF. On the other hand, when the NMOS transistors N1, N4 are turned on, the output voltage produced at the output terminal OUT2 is fed back via the NMOS transistor N9 which is then turned on to the differential amplifier circuit 2 to effect output voltage control similarly to the above.

In recent years, there has been a growing demand for incorporating a line driver of this kind constructed as above into LSI's which can be driven by both a 5 volt power source and a 3 volt power source, with a demand for lowering the power supply voltage for LSI's in general. The construction of the line driver in FIG. 1, however, suffers from the problem that the NMOS transistors N8, N9 as transfer gates cannot perform the voltage transfer function as desired if the power supply voltage is lowered.

This problem will now be explained more in detail. The NMOS transistors N8, N9 are used as transfer gates whose sources and drains assume intermediate potentials. In the illustrated example, the terminals of the NMOS transistors N8, N9 on the PMOS transistor P2 side are considered to be the sources. Provided that the power supply voltage is designated by VDD and the threshold voltage of the NMOS transistors N8, N9 by VTH, when the gates of the NMOS transistors N8, N9 are driven by the power supply voltage VDD, the source potential can rise up to VDD VTH. For example, when VDD=5 volts, VTH=2 volts, and VREF=2 volts, the source potential can rise up to 3 volts, and therefore the output voltage from the output terminals OUT1, OUT2 can be surely maintained at the reference voltage VREF. However, when VDD=3 volts, even if the output terminal OUT1 or OUT2 assumes 2 volts or more, the NMOS transistors N8 or N9 will be turned off when the source potential rises to VDD−VTH=1 volt. In other words, the NMOS transistors N8, N9 cannot transfer voltage required for feedback control of the output voltage to the differential amplifier circuit 2.

SUMMARY OF THE INVENTION

It is therefore an object of the invention to provide a driving circuit which is capable of effecting the output voltage feedback control without fail even when a low-voltage power source is employed.

To attain the above object, the present invention provides a driving circuit having first and second output terminals for connection with a load, for supplying the load with a constant voltage changing in polarity at predetermined timing, through the output terminals, comprising a constant current source, a bridge circuit having a plurality of current changeover switching elements connected to each other in bridge connection, and first and second output nodes connected, respectively, to the first and second output terminals, a selector circuit for selectively driving the plurality of current changeover switching elements of the bridge circuit, a first differential amplifier circuit having first and second input terminals, one of which is supplied with a predetermined reference voltage and the other is connected to one of the first and second output nodes of the bridge circuit, and an output terminal, a second differential amplifier circuit having first and second input terminals, one of which is supplied with the predetermined reference voltage and the other is connected to the other of the first and second output nodes of the bridge circuit, and an output terminal connected to the output terminal of the first differential amplifier circuit to form a common output terminal together therewith, a switching circuit responsive to selective driving of the plurality of current changeover switching elements of the bridge circuit by the selector circuit, for selectively connecting the first and second differential amplifier circuits to a power source, and a bypass circuit connected to the common output terminal of the first and second differential amplifier circuits to have conductivity thereof controlled by an output from the common output terminal of the first and second differential amplifier circuits, for bypassing part of current from the constant current source such that output voltage from the bridge circuit becomes equal to the predetermined reference voltage.

In a preferred form, the current changeover switching elements of the bridge circuit are formed by a plurality of n-channel MOS transistors. The first and second differential amplifier circuits each have a pair of p-channel MOS transistors for differential amplification, and further have a current mirror circuit formed of a pair of n-channel MOS transistors forming a common active load on the pair of p-channel MOS transistors for differential amplification of the first and second differential amplifier circuits.

Alternatively, the first and second differential amplifier circuits each have a pair of p-channel MOS transistors for differential amplification and further have first and second current mirror circuits each formed of a pair of n-channel MOS transistors forming active loads on the pair of p-channel MOS transistors for differential amplification of respective ones of the first and second differential amplifier circuits.

Preferably, the pair of p-channel MOS transistors for differential amplification of each of the first and second differential amplifier circuits have sources thereof connected to each other, and the switching circuit is formed of a p-channel MOS transistor connected between the sources of the pair of p-channel MOS transistors for differential amplification connected to each other and the power source.

With the above construction, according to the invention, to effect selective feedback control of the output voltage, instead of using transfer gates conventionally employed, the first and second differential amplifier circuits are provided to which the first and two output nodes of the bridge circuit are directly connected for feedback control of the output voltage thereto. These differential amplifier circuits are selectively activated and deactivated by the switching circuit in response to outputs from the bridge circuit, such that one of the differential amplifier circuits is connected to the power source (activated), and the other is disconnected from the power source (deactivated). The activated differential amplifier circuit controls bypass control of an extra amount of current from the constant current source for the bridge circuit, thus performing feedback control of the output voltage from the bridge circuit, similarly to the conventional driving circuit.

Therefore, according to the invention, the output voltage from the bridge circuit can be transferred to the differential amplifier circuits without being dropped at all, irrespective of the power source voltage employed, thus enabling the feedback control of maintaining the output voltage at a constant level even when a low-voltage power source is employed.

The above and other objects, features, and advantages of this invention will become more apparent from the following detailed description taken in conjunction with the accompanying drawings.

DETAILED DESCRIPTION

The invention will now be described in detail with reference to the drawings showing embodiments thereof.

Figure 1:
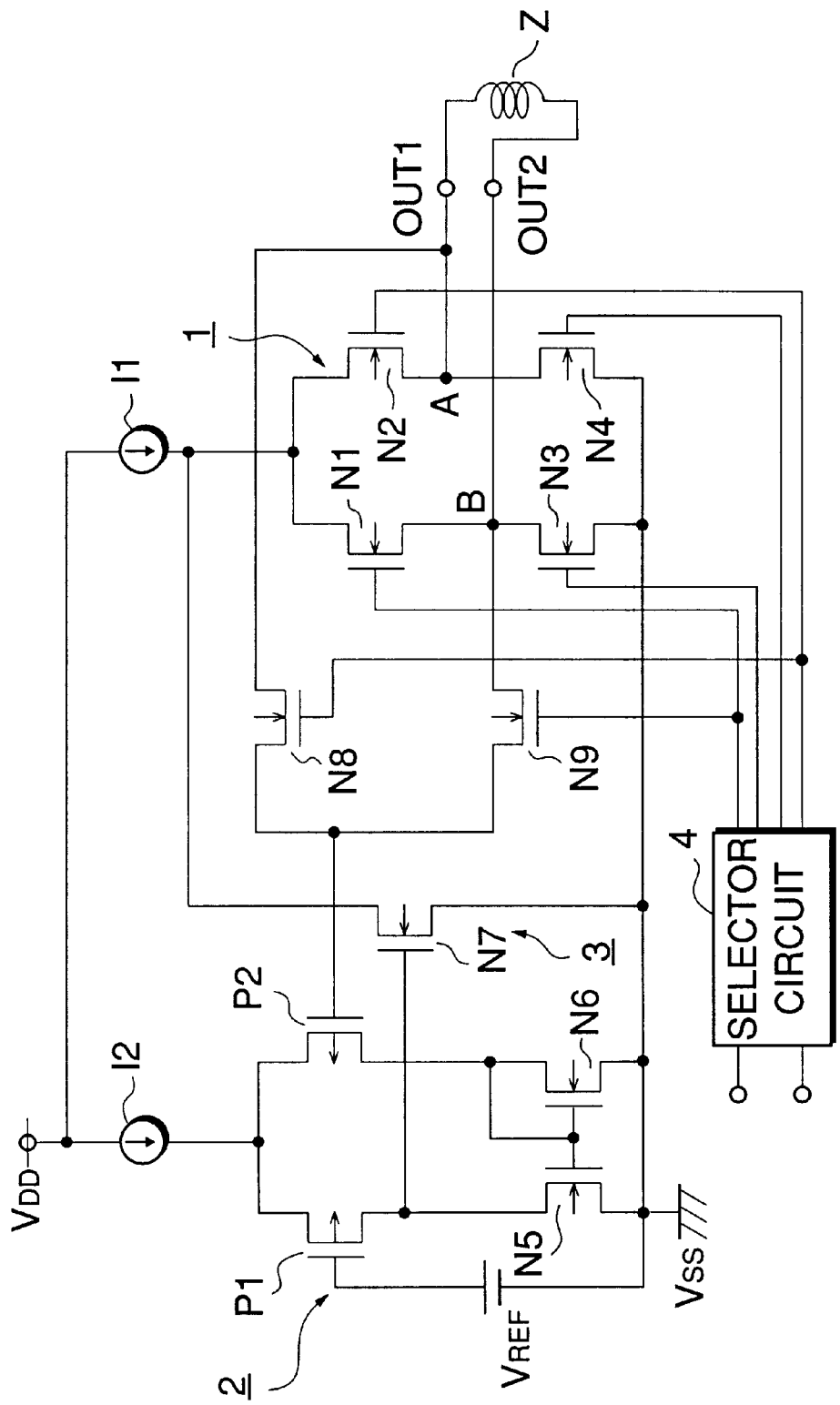
FIG. 1 is a circuit diagram showing the configuration of a conventional driving circuit.
Figure 2:
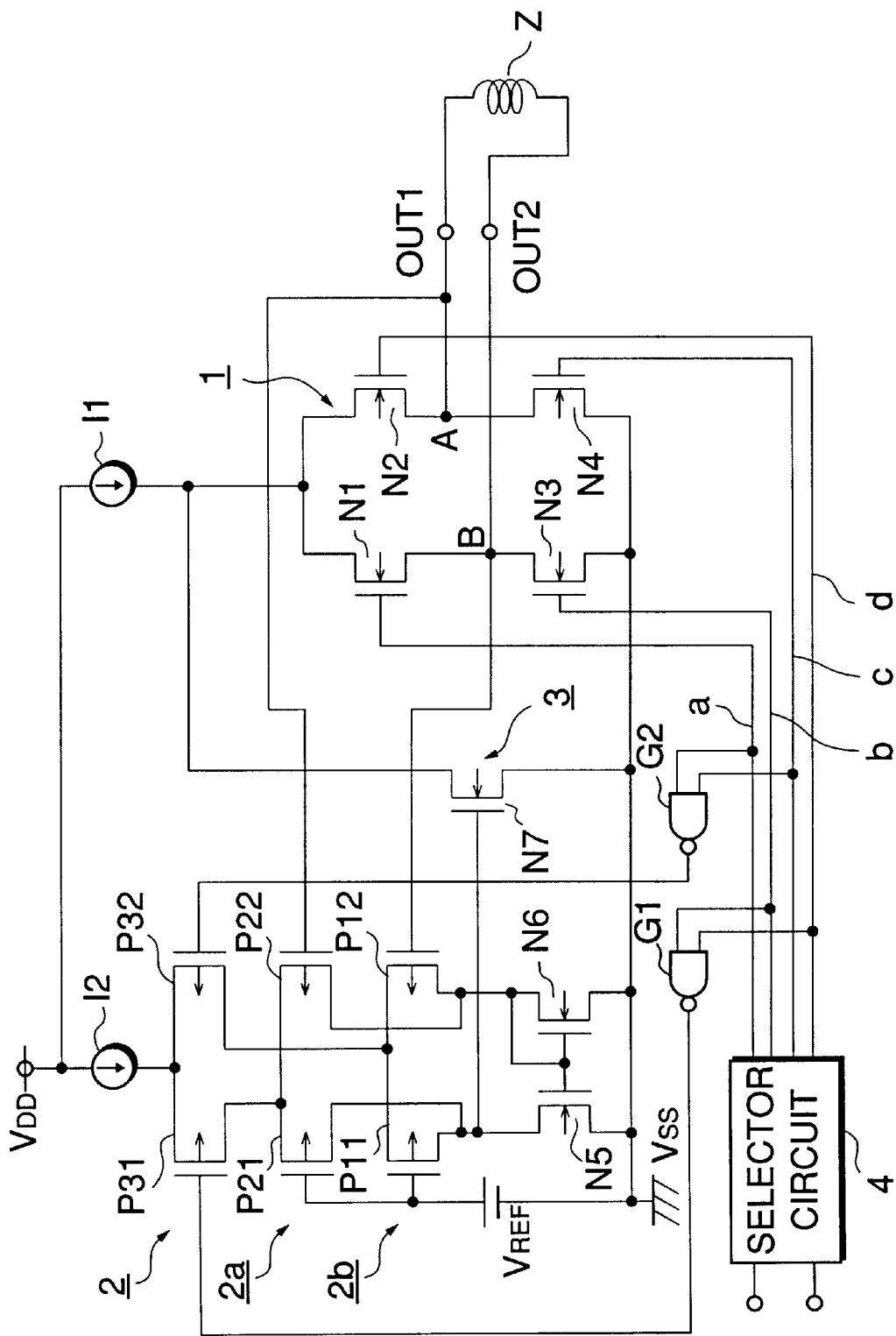
FIG. 2 is a circuit diagram showing the configuration of a driving circuit according to one embodiment of the present invention.

FIG. 2 is a circuit diagram of a driving circuit according to one embodiment of the invention, in which the driving circuit is applied as the line driver. In the figure, elements and parts corresponding to those in FIG. 1 are designated by identical reference numerals, and detailed description thereof is omitted. In this embodiment, the transfer gates formed by the NMOS transistors N8, N9 in FIG. 1 are omitted, and the output nodes A, B of the bridge circuit 1 are directly connected to first and second differential amplifier circuits 2a and 2b, for feedback control of the output voltage thereto.

The first and second differential amplifier circuits 2a, 2b are CMOS amplifier circuits which are comprised of a pair of PMOS transistors P21 and P22 for differential amplifification, and a pair of PMOS transistors P11 and P12 for differential amplification, respectively, the two pairs of PMOS transistors having a common active load formed by the current mirror circuit formed of the NMOS transistors N5, N6. The PMOS transistors P21, P11 have drains thereof commonly connected to the drain of the NMOS transistor N5, and gates thereof commonly supplied with the reference voltage VREF. On the other hand, the PMOS transistors P22, P12 have drains thereof commonly connected to the drain of the NMOS transistor N6 and gates thereof directly connected, respectively, to the output nodes A, B of the bridge circuit 1.

The PMOS transistors P21, P22 of the first differential amplifier circuit 2a have sources thereof commonly connected to the current source I2 on the power source VDD side via a PMOS transistor P31, while the PMOS transistors P11, P12 have sources thereof commonly connected to the current source I2 via a PMOS transistor P32. These PMOS transistors P31, P32 form a switching circuit 5 which selectively activates the first and second differential amplifier circuits 2a, 2b, and is controlled by outputs from the selector circuit 4. More specifically, the PMOS transistor P31 has its gate driven by an output from a NAND gate G1 which assumes a low level "L" when outputs b and d from the selector circuit 4 which drive the NMOS transistors N2, N3 of the bridge circuit 1 are both at a high level "H", while the PMOS transistor P32 has its gate driven by an output from a NAND gate G2 which assumes "L" when outputs a and c from the selector circuit 4 which drive the NMOS transistors N1, N4 of the bridge circuit 1 are both at "H".

The drains of the PMOS transistors P21, P11 and the NMOS transistor N5 are commonly connected together to form a common output terminal of the first and second differential amplifier circuits 2a, 2b. In other words, the first and second differential amplifier circuits 2a, 2b have a common active load and a common current source as well as a common output terminal, and the conductivity of the NMOS transistor N7 of the bypass circuit 3 is controlled in response to voltage at the common output terminal of the first and second differential amplifier circuits 2a, 2b.

The operation of the line driver constructed as above will now be described. When the NMOS transistors N2, N3 of the bridge circuit 1 are simultaneously turned on, output voltage appears at the line output terminal OUT1 connected to the output node A, as mentioned before. On this occasion, the output from the NAND gate G1 assumes "L", and hence the PMOS transistor P31 of the switching circuit 5 is ON, and the PMOS transistor P32 of the same is OFF so that the first differential amplifier circuit 2a is activated. Then, voltage at the output node A of the bridge circuit 1 is applied to the activated first differential amplifier circuit 2a, and the conductivity of the NMOS transistor N7 is controlled in response to the output from the first differential amplifier circuit 2a to feedback-control the output voltage at the output node A such that the output voltage becomes equal to the reference voltage VREF. On the other hand, when the NMOS transistors N1, N4 of the bridge circuit 1 are simultaneously turned on, the output from the NAND gate G2 assumes "L" to activate the second differential amplifier circuit 2b to carry out feedback control of output voltage at the output node B in a similar manner to the above.

As described above, according to the present embodiment, the output nodes A, B of the bridge circuit 1 are directly connected, respectively, to the input terminals of the first and second differential amplifier circuits 2a, 2b without intervention of transfer gates. As a result, even when a low-voltage power source is employed, the feedback control of the output voltage can be effected without fail. Further, by virtue of employment of the first and second differential amplifier circuits 2a, 2b which are CMOS differential amplifier circuits, the higher output voltage is not limited by the threshold value of the PMOS transistors, nor the lower output voltage by the NMOS transistors, enabling the output voltage to be controlled within the power supply voltage range. Therefore, in both cases of VDD=5 volts and VDD=3 volts provided that VREF=2 volts, for instance, the feedback control can be achieved to maintain the output voltage at 2 volts, without fail.

Figure 3:
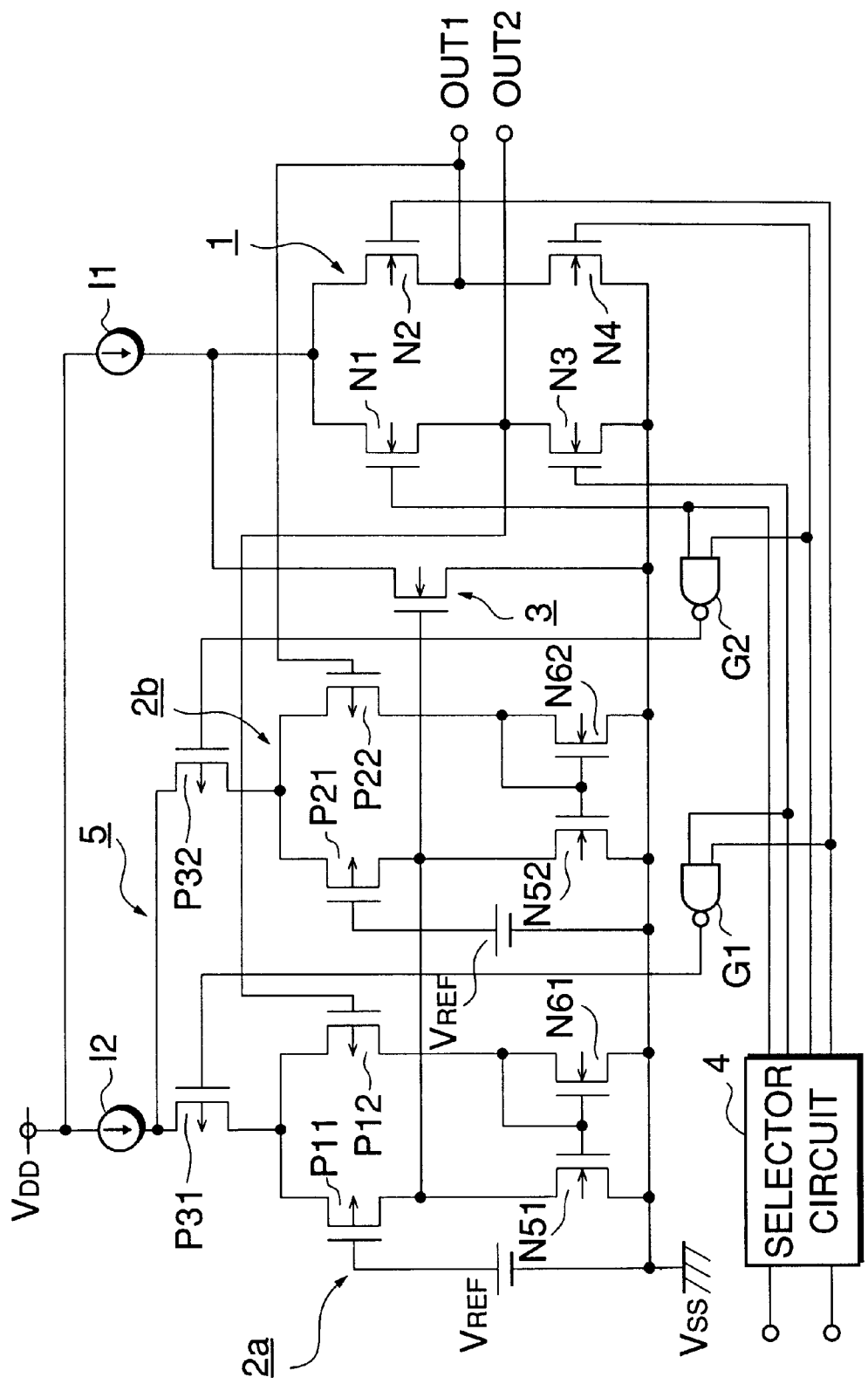
FIG. 3 is a circuit diagram showing the configuration of a driving circuit according to another embodiment of the present invention.

FIG. 3 shows the configuration of another embodiment of the invention. In the figure, elements and parts corresponding to those in FIG. 2 of the first embodiment are designated by identical reference numerals, detailed description of which is omitted. In this embodiment, two separate active load current circuits formed, respectively, of a pair of NMOS transistors N51 and N61, and a pair of NMOS transistors N52 and N62 are provided, respectively, for the first and second differential amplifier circuits 2a, 2b. Even according to this embodiments, substantially the same effects as those of the first embodiment described above can be obtained.

As described above, according to the invention, the feedback control of the output voltage is effected without the use of transfer gates, by providing two differential amplifier circuits which are selectively activated and deactivated by a switching circuit. As a result, even when a low-voltage power source is employed, the output voltage feedback control can be positively performed without fail, and the driving circuit is therefore suitable for use as a S/T point driver or the like.

What is claimed is:

1. A driving circuit having first and second output terminals for connection with a load, for supplying said load with a constant voltage changing in polarity at predetermined timing, through said output terminals, comprising:

a constant current source;

a bridge circuit having a plurality of current changeover switching elements connected to each other in bridge connection, and first and second output nodes connected, respectively, to said first and second output terminals;

a selector circuit for selectively driving said plurality of current changeover switching elements of said bridge circuit;

a first differential amplifier circuit having first and second input terminals, one of which is supplied with a predetermined reference voltage and the other is connected to one of said first and second output nodes of said bridge circuit, and an output terminal;

a second differential amplifier circuit having first and second input terminals, one of which is supplied with said predetermined reference voltage and the other is connected to the other of said first and second output nodes of said bridge circuit, and an output terminal connected to said output terminal of said first differential amplifier circuit to form a common output terminal together therewith;

a switching circuit responsive to selective driving of said plurality of current changeover switching elements of said bridge circuit by said selector circuit, for selectively connecting said first and second differential amplifier circuits to a power source; and a bypass circuit connected to said common output terminal of said first and second differential amplifier circuits to have conductivity thereof controlled by an output from said common output terminal of said first and second differential amplifier circuits, for bypassing part of current from said constant current source such that output voltage from said bridge circuit becomes equal to said predetermined reference voltage.

2. A driving circuit as claimed in claim 1, wherein said current changeover switching elements of said bridge circuit are formed by a plurality of n-channel MOS transistors, said first and second differential amplifier circuits each having a pair of p-channel MOS transistors for differential amplification, said first and second differential amplifier circuits further having a current mirror circuit formed of a pair of n-channel MOS transistors forming a common active load on said pair of p-channel MOS transistors for differential amplification of said first and second differential amplifier circuits.

3. A driving circuit as claimed in claim 2, wherein said pair of p-channel MOS transistors for differential amplification of each of said first and second differential amplifier circuits have sources thereof connected to each other, said switching circuit being formed of a p-channel MOS transistor connected between said sources of said pair of p-channel MOS transistors for differential amplification connected to each other and said power source.

4. A driving circuit as claimed in claim 1, wherein said current changeover switching elements of said bridge circuit are formed by a plurality of n-channel MOS transistors, said first and second differential amplifier circuits each having a pair of p-channel MOS transistors for differential amplification, said first and second differential amplifier circuits further having first and second current mirror circuits each formed of a pair of n-channel MOS transistors forming active loads on said pair of p-channel MOS transistors for differential amplification of respective ones of said first and second differential amplifier circuits.

5. A driving circuit as claimed in claim 4, wherein said pair of p-channel MOS transistors for differential amplification of each of said first and second differential amplifier circuits have sources thereof connected to each other, said switching circuit being formed of a p-channel MOS transistor connected between said sources of said pair of p-channel MOS transistors for differential amplification connected to each other and said power source.

\* \* \* \* \*